United States Patent
Lv et al.

(10) Patent No.: US 10,976,843 B2
(45) Date of Patent: Apr. 13, 2021

(54) ARRAY SUBSTRATE AND TOUCH DISPLAY DEVICE

(71) Applicants: BOE TECHNOLOGY GROUP CO., LTD., Beijing (CN); Hefei BOE Optoelectronics Technology Co., Ltd., Anhui (CN)

(72) Inventors: Jing Lv, Beijing (CN); Xianjie Shao, Beijing (CN)

(73) Assignees: BOE Technology Group Co., Ltd., Beijing (CN); Hefei BOE Optoelectronics Technology Co., Ltd., Anhui (CN)

( * ) Notice: Subject to any disclaimer, the term of this patent is extended or adjusted under 35 U.S.C. 154(b) by 170 days.

(21) Appl. No.: 16/052,373

(22) Filed: Aug. 1, 2018

(65) Prior Publication Data

US 2019/0204967 A1  Jul. 4, 2019

(30) Foreign Application Priority Data

Jan. 3, 2018  (CN) .......................... 201810004726.0

(51) Int. Cl.
*G06F 3/041* (2006.01)
*G06F 3/044* (2006.01)
*G02F 1/1333* (2006.01)
*G02F 1/1343* (2006.01)
*G02F 1/1335* (2006.01)
*H01L 27/32* (2006.01)

(52) U.S. Cl.
CPC ........ *G06F 3/0412* (2013.01); *G02F 1/13338* (2013.01); *G02F 1/133514* (2013.01); *G02F 1/134309* (2013.01); *G06F 3/044* (2013.01); *G06F 3/0443* (2019.05); *G02F 1/134345* (2021.01); *H01L 27/323* (2013.01)

(58) Field of Classification Search
None
See application file for complete search history.

(56) References Cited

U.S. PATENT DOCUMENTS 9,690,420 B2 *  6/2017  Lee .................... G09G 3/3648
2009/0289912 A1  11/2009  Chen et al.

FOREIGN PATENT DOCUMENTS

| CN | 104571713 A | 4/2015 |
| CN | 106125989 A | 11/2016 |
| CN | 106293195 A | 1/2017 |
| CN | 106681045 A | 5/2017 |
| CN | 106873226 A | 6/2017 |
| JP | 2014-238619 A | 12/2014 |

OTHER PUBLICATIONS

Chinese Office Action dated Jan. 20, 2020, from application No. 201810004726.0.
Second Office Action issued in Chinese Application No. 201810004726.0 dated Oct. 9, 2020 with English translation (16p).

* cited by examiner

*Primary Examiner* — Brian M Butcher
(74) *Attorney, Agent, or Firm* — Arch & Lake LLP

(57) ABSTRACT

The disclosure provides an array substrate and a touch display device and relates to the field of touch technology. The array substrate includes a plurality of pixels arranged in an array, and a plurality of touch electrode lines arranged along a direction of data lines. There is at least one of the touch electrode lines distributed in each of the pixels. In the pixels of the same row, the touch electrode lines have different arrangement positions relative to corresponding pixels.

10 Claims, 4 Drawing Sheets ary SUBSTRATE AND TOUCH DISPLAY
DEVICE

CROSS REFERENCE

The present disclosure claims priority to Chinese Patent Application No. 201810004726.0 filed on Jan. 3, 2018, and the entire contents thereof are incorporated herein by reference.

TECHNICAL FIELD

The present disclosure relates to the field of touch technology, and in particular, to an array substrate and a touch display device.

BACKGROUND

With the maturing of touch technology, touch display devices have been spread throughout people's daily lives. Compared with conventional input devices such as mice, buttons and joysticks, touch screens are gradually becoming the mainstream input devices because of their advantages such as ease of use, operational versatility, decreasing prices, and steadily increasing yield rates.

It should be noted that the information disclosed in the foregoing background section is only for enhancement of understanding of the background of the present disclosure and therefore may include information that does not constitute prior art already known to those skilled in the art.

SUMMARY

According to an aspect of the present disclosure, there is provided an array substrate including a plurality of pixels arranged in an array, and a plurality of touch electrode lines arranged along a direction of data lines. There is at least one of the touch electrode lines distributed in each of the pixels.

In the pixels of the same row, the touch electrode lines have different arrangement positions relative to corresponding pixels.

In an exemplary arrangement of the present disclosure, the pixels each include M sub-pixels, and there are N touch electrode lines distributed in each of the pixels.

In $C_M^N$ successively adjacent pixels in each row, the touch electrode lines do not have repeated arrangement positions relative to corresponding pixels in the $C_M^N$ pixels.

M and N are both positive integers, and M>N.

In an exemplary arrangement of the present disclosure, each touch electrode line is disposed adjacent to a data line of the pixel in which it is disposed.

In an exemplary arrangement of the present disclosure, the pixels each include three sub-pixels, and there is one touch electrode line distributed in each of the pixels.

In each row of three successively adjacent pixels, the arrangement positions of the touch electrode lines in the three pixels are respectively in the first sub-pixel, the second sub-pixel, and the third sub-pixel.

In an exemplary arrangement of the present disclosure, the pixels each include three sub-pixels, and there are two touch electrode lines distributed in each of the pixels.

In each row of three successively adjacent pixels, the arrangement positions of the touch electrode lines in the three pixels are respectively in the first and second sub-pixels, in the second and third sub-pixels, and in the first and third sub-pixels.

In an exemplary arrangement of the present disclosure, the pixels each include four sub-pixels, and there is one touch electrode line distributed in each of the pixels.

In each row of four successively adjacent pixels, the arrangement positions of the touch electrode lines in the four pixels are respectively in the first sub-pixel, the second sub-pixel, the third sub-pixel, and the fourth sub-pixel.

In an exemplary arrangement of the present disclosure, the pixels each include four sub-pixels, and there are two touch electrode lines distributed in each of the pixels.

In each row of six successively adjacent pixels, the arrangement positions of the touch electrode lines in the six pixels are respectively in the first and second sub-pixels, in the first and third sub-pixels, in the first and fourth sub-pixels, in the second and third sub-pixels, in the second and fourth sub-pixels, and in the third and fourth sub-pixels.

In an exemplary arrangement of the present disclosure, the array substrate further includes a plurality of common electrodes arranged in an array which are used as touch electrodes.

The touch electrodes are connected with corresponding touch electrode lines through vias.

In an exemplary arrangement of the present disclosure, the array substrate further includes a plurality of touch switches and a touch circuit connected to the touch switches.

The touch switches are connected with the touch electrode lines in one-to-one correspondence.

According to an aspect of the present disclosure, there is provided a touch display device including the above array substrate.

In an exemplary arrangement of the present disclosure, the touch display device further includes a color film substrate provided relative to the array substrate with cells being aligned, and a liquid crystal layer disposed between the array substrate and the color film substrate.

In an exemplary arrangement of the present disclosure, the touch display device further includes a package substrate provided relative to the array substrate with cells being aligned, and organic light emitting elements disposed on the array substrate.

It is to be understood that both the foregoing general description and the following detailed description are exemplary and explanatory only and are not to limit the disclosure

BRIEF DESCRIPTION OF THE DRAWINGS

The accompanying drawings herein are incorporated in and constitute part of this specification, illustrate arrangements consistent with the present disclosure, and together with the description serve to explain the principles of the disclosure. Obviously, the drawings in the following description are merely some arrangements of the present disclosure, and based thereon those skilled in the art can also obtain other drawings without any creative effort.

DETAILED DESCRIPTION

Figure 1:
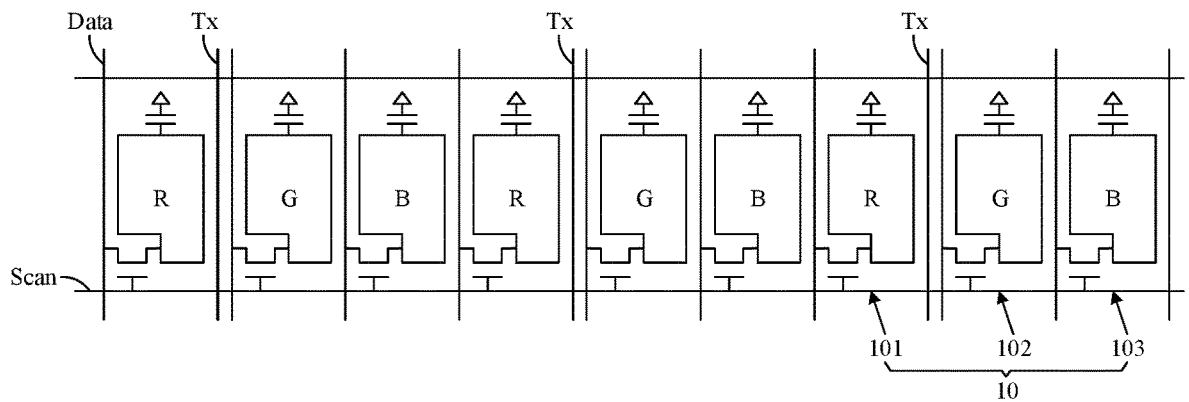
FIG. 1 schematically shows a schematic view of a self-capacitance in-cell pixel structure in a comparative arrangement of the present disclosure.

Exemplary arrangements will now be described more fully with reference to the accompanying drawings. However, the exemplary arrangements may be implemented in various ways and should not be construed as being limited to the examples set forth herein; rather, these arrangements are provided such that this disclosure will be more complete and full, and will fully convey the concept of the exemplary arrangements to those skilled in the art. The described features, structures, or characteristics may be combined in any suitable manner in one or more arrangements. In the following description, numerous specific details are given to provide a thorough understanding of the arrangements of the present disclosure. However, those skilled in the art will recognize that the technical solutions of the present disclosure may be practiced while omitting one or more of the specific details, or other methods, elements, devices, steps, etc. may be employed. In other instances, well-known technologies are not shown or described in detail to avoid obscuring aspects of the present disclosure.

Moreover, the drawings are merely schematic illustrations of the present disclosure and are not necessarily drawn to scale. The thickness and shape of each layer in the drawings do not reflect true scale, and are only for the convenience of describing the contents of the present disclosure. The same reference numerals in the drawings denote the same or similar parts, and their repeated description will be omitted.

Figure 2:
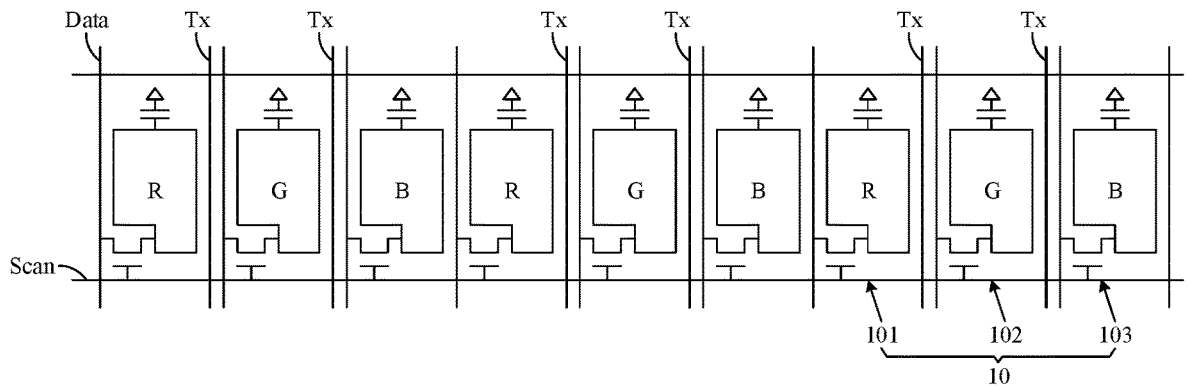
FIG. 2 schematically shows a schematic view of a self-capacitance in-cell pixel structure in another comparative arrangement of the present disclosure.

FIG. 1 and FIG. 2 are schematic structural views of a comparative self-capacitance in-cell pixel design. In the pixel structure shown in FIG. 1, in each pixel 10 (including the red R sub-pixel 101, the green G sub-pixel 102, and the blue B sub-pixel 103) there is distributed one touch electrode line Tx, and the touch electrode lines Tx within the perspective pixels 10 are all disposed in the red R sub-pixels 101. In the pixel structure shown in FIG. 2, there are two touch electrode lines Tx distributed in each pixel 10 (including a red R sub-pixel 101, a green G sub-pixel 102, and a blue B sub-pixel 103), and the touch electrode lines Tx within the perspective pixels 10 are all disposed in the red R sub-pixels 101 and the green G sub-pixels 102. It can be seen that in the comparative pixel design, the arrangement of the touch electrode lines Tx in all the pixels 10 is the same.

Figure 3:
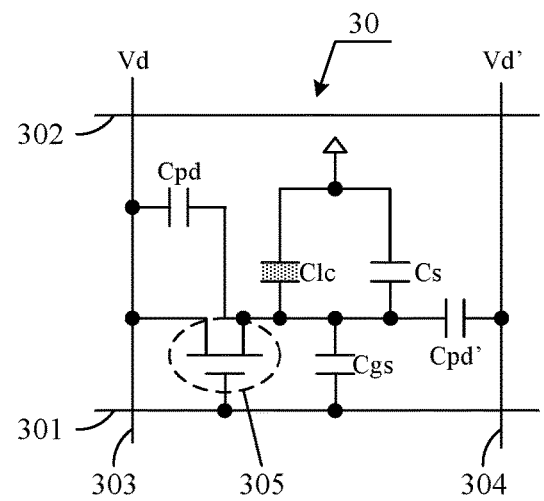
FIG. 3 schematically shows a schematic view of capacitance distribution in a sub-pixel of a liquid crystal display panel of the present disclosure.

On this basis, since the touch electrode line Tx and the data line Data are arranged in parallel, the presence of the touch electrode lines Tx necessarily affects the size of the parasitic capacitance between the data lines Data and the pixel electrodes in the adjacent sub-pixels. Take a LCD panel adopting a column inversion driving mode as an example. FIG. 3 is a schematic view of a capacitance distribution in a sub-pixel 30, in which the scan lines Scan (301, 302) and the data lines Data (303, 304) and the thin-film transistor 305 connected to both the scan line 301 and the data line 303 for forming the sub-pixel 30 are shown.

In the current frame, the data signal voltage of the data line 303 corresponding to the sub-pixel 30 is Vd+, and the data signal voltage of the data line 304 corresponding to the adjacent sub-pixel is Vd'−, then the total charge of all the capacitors in the sub-pixel 30 is:

$$Q=C_s(V_P-V_{com})+C_{lc}(V_P-V_{com})+C_{gs}(V_P-V_{gl})+C_{pd}(V_P-V_{d+})+C_{pd'}(V_P-V_{d'-});$$

where Q is the total charge of the sub-pixel in the current frame, $C_s$ is the storage capacitance between the pixel electrode and the common electrode, $C_{lc}$ is the liquid crystal capacitance, $C_{gs}$ is the parasitic capacitance between the gate and the source, $C_{pd}$ is the parasitic capacitance between the pixel electrode and the data line corresponding to the sub-pixel, $C_{pd'}$ is the parasitic capacitance between the pixel electrode and the data line corresponding to the adjacent sub-pixel, $V_p$ is the voltage of the pixel electrode of the current frame, $V_{com}$ is the voltage of the common electrode, $V_{gl}$ is the scan signal voltage corresponding to the sub-pixel, $V_{d+}$ is the data signal voltage corresponding to the sub-pixel in the current frame, and $V_{d'-}$ is the data signal voltage corresponding to the adjacent sub-pixel in the current frame.

In the next frame, the voltage of the data signal of the data line 301 corresponding to the sub-pixel 30 changes from $V_{d+}$ to $V_{d-}$, and the voltage of the data signal of the data line 304 corresponding to the adjacent sub-pixel changes from $V_{d'-}$ to $V_{d'+}$. The total charge change of all capacitors in sub-pixel 30 is:

$$Q'=C_s(V_{P'}-V_{com})+C_{lc}(V_{P'}-V_{com})+C_{gs}(V_{P'}-V_{gl})+C_{pd}(V_{P'}-V_{d-})+C_{pd'}(V_{P'}-V_{d'+});$$

where Q' is the total charge of the sub-pixel in the next frame, $C_s$ is the storage capacitance between the pixel electrode and the common electrode, $C_{lc}$ is the liquid crystal capacitance, $C_{gs}$ is the parasitic capacitance between the gate and the source, and $C_{pd}$ is the parasitic capacitance between the pixel electrode the data line corresponding to the sub-pixel, $C_{pd'}$ is the parasitic capacitance between the pixel electrode and the data line corresponding to the adjacent sub-pixel, $V_{p'}$ is the voltage of the pixel electrode of the next frame, $V_{com}$ is the voltage of the common electrode, $V_{gl}$ is the scan signal voltage corresponding to the sub-pixel, $V_{d-}$ is the data signal voltage corresponding to the sub-pixel in the next frame, and $V_{d'+}$ is the data signal voltage corresponding to the adjacent sub-pixel in the next frame.

Based on the above total charge distribution change, the voltage change amount $\Delta V_p$ of the pixel electrode can be obtained according to the law of conservation of electric charge:

$$\Delta V_P = V_P - V_{P'} = \frac{C_{pd} - C_{pd'}}{C_s + C_{lc} + C_{gs} + C_{pd} + C_{pd'}} \cdot 2V_{d-}.$$

Based on the above formula, it can be seen that when the difference between $C_{pd}$ and $C_{pd'}$ is large enough to the extent that ΔVp can be distinguished by the human eye, the LCD panel will display an abnormal macroscopic display of colors. For example, in the pixel structure shown in FIG. 1, for the red R sub-pixel 101, the shielding and isolation of the touch electrode line Tx causes the parasitic capacitance $C_{pd'}$ between the pixel electrode 100 and the data line Data corresponding to the adjacent sub-pixel to be small, which results in a difference among the luminance of the red R sub-pixel 101 and the luminance of the green G sub-pixel 102 and the blue B sub-pixel 103, and the macroscopic color abnormality which is mainly manifested by, under the L127 gray scale, the scan of the scan line Gate is reddish at the proximal end and blued at the distal end.

Figure 4:
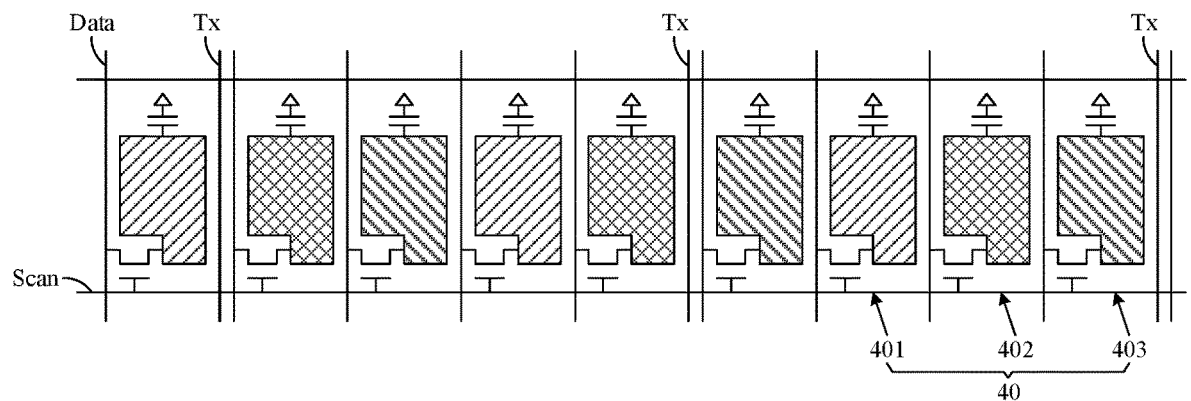
FIG. 4 schematically shows a first schematic view of a self-capacitance in-cell pixel structure in an exemplary arrangement of the present disclosure.
Figure 5:
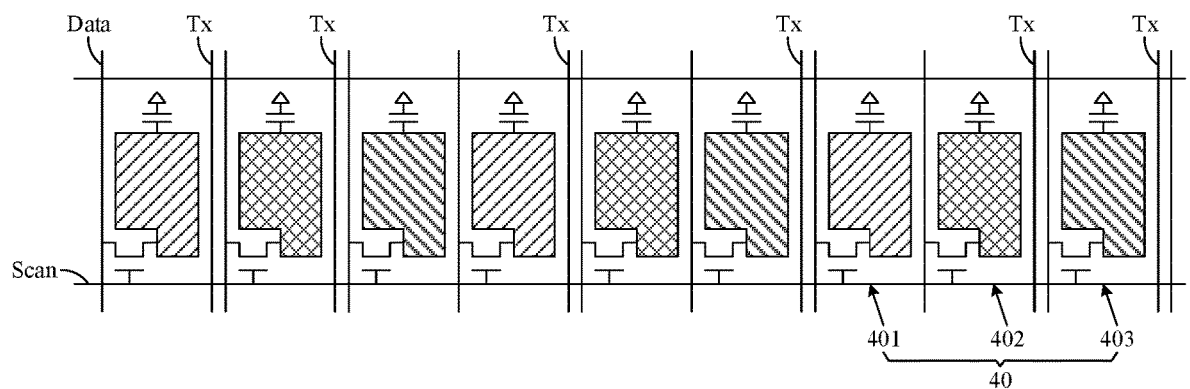
FIG. 5 schematically shows a second schematic view of a self-capacitance in-cell pixel structure in an exemplary arrangement of the present disclosure.
Figure 6:
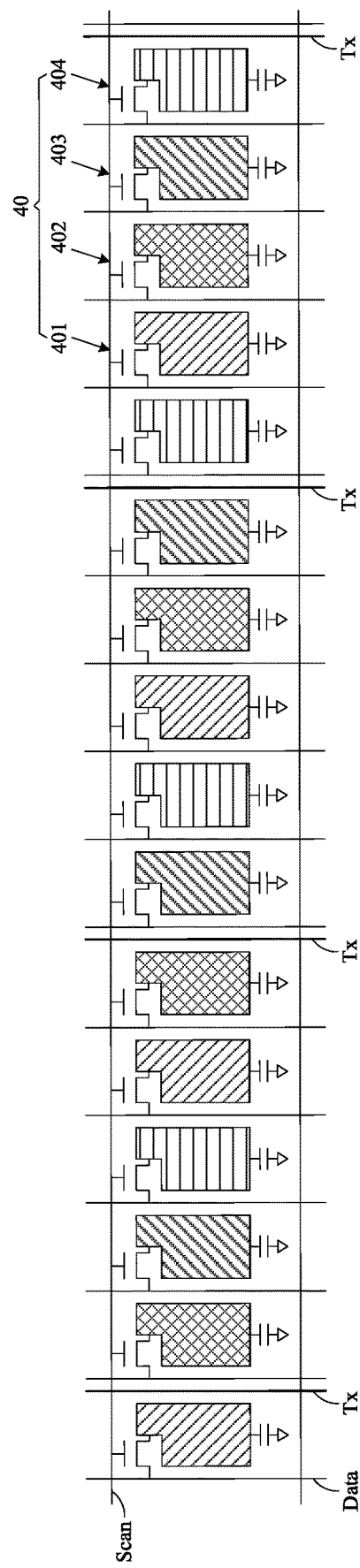
FIG. 6 schematically shows a third schematic view of a self-capacitance in-cell pixel structure in an exemplary arrangement of the present disclosure.

On this basis, as shown in FIG. 4 to FIG. 6, the present exemplary arrangement provides an array substrate including scan lines Scan and data lines Data interleaved horizontally and vertically, a plurality of pixels 40 arranged in array defined by the scan lines Scan and the data lines Data, and a plurality of touch electrode lines Tx arranged along the direction of data lines Data.

In the arrangement, there is at least one touch electrode line Tx distributed in each pixel 40, and in all the pixels 40 in the same row, the arrangement positions of the touch electrode lines Tx in the perspective pixels 40 are different.

It should be noted that the difference in the arrangement positions of the touch electrode lines Tx in the perspective pixels 40 may refer to the case that the arrangement positions of the touch electrode lines Tx in the perspective pixels 40 relative to the corresponding pixels 40 are not exactly the same. Take as an example that there is one touch electrode line Tx disposed in each pixel 40. The touch electrode line Tx is disposed in the first sub-pixel 401 of the first pixel 40, and in the second sub-pixel 402 of the second pixel 40. Further, as those skilled in the art would realize, if the touch electrode line Tx is actually disposed inside a light emitting region of the pixel 40, a opaque touch electrode line will absorb light and thus reduce the aperture ratio of the pixel. Accordingly, in the present disclosure, such description as a touch electrode line being disposed in a pixel may refer to the case where the touch electrode line is disposed by the pixel at a non-light emitting region, e.g., at a position adjacent to a data line connected to the pixel.

The array substrate provided by the exemplary arrangement of the present disclosure is mainly applied to the case where the number of touch electrode lines Tx provided and the number of sub-pixels included in the pixel 40 are not equal. Specifically, in the present exemplary arrangement the positions of the touch electrode lines Tx in the perspective pixels 40 are not completely the same, thus preventing the effect of isolation and shielding of the touch electrode lines Tx from being focused on a specific sub-pixel to make the sub-pixel have relatively different capacitance distribution than other sub-pixels, and thus alleviating the color display abnormality caused by the touch electrode lines Tx and improving the display quality and yield of the display products.

In the present exemplary arrangement, the pixel 40 may include M sub-pixels 40 in each of which there are distributed N touch electrode lines Tx. In $C_M^N$ successively adjacent pixels in each row, the touch electrode lines do not have repeated arrangement positions relative to corresponding pixels in the $C_M^N$ pixels, where M and N are both positive integers, and M>N, that is, the number of sub-pixels is greater than the number of touch electrode lines Tx in each pixel 40.

In a specific arrangement of the present example, referring to FIG. 4, the pixels 40 may each include three sub-pixels, and there is one touch electrode line distributed in each of the pixels. In this arrangement, in each row of three successively adjacent pixels, the arrangement positions of the touch electrode lines in the three pixels are respectively in the first sub-pixel 401 of the first pixel 40, the second sub-pixel 402 of the second pixel 40, and the third sub-pixel 403 of the third pixel 40. It should be noted that the positions of the touch electrode lines Tx in the three pixels 40 may be adjusted as long as they are not repeatedly disposed in the same sub-pixels.

In this way, in three successively adjacent pixels 40 of the same row, the touch electrode lines Tx may be evenly and non-repeatedly distributed in the first sub-pixel 401, the second sub-pixel 402, and the third sub-pixel 403, whereby the display abnormality caused by the wiring positions the touch electrode lines Tx can be effectively prevented.

In another arrangement of the present example, referring to FIG. 5, the pixel 40 may include three sub-pixels, and there are two touch electrode lines Tx distributed in each pixel 40. In the arrangement, in each row of three successively adjacent pixels 40, the arrangement positions of the touch electrode lines Tx in the three pixels are respectively in the first and second sub-pixels 401 and 402 of the first pixel 40, in the second and third sub-pixels 402 and 403 of the second pixel 40, and in the first and third sub-pixels 401 and 403 of the third pixel 40. It should be noted that the arrangement positions of the touch electrode lines Tx in the three pixels 40 may be adjusted as long as they are not repeatedly disposed in the same sub-pixels.

In this way, in the same row of three successively adjacent pixels 40, the touch electrode lines Tx may be evenly and non-repeatedly distributed in the first sub-pixel 401, the second sub-pixel 402, and the third sub-pixel 403. Therefore, the display abnormality caused by the wiring positions the touch electrode lines Tx can be effectively prevented.

In still another specific arrangement of the present example, as shown in FIG. 6, the pixels 40 each include four sub-pixels, and there is one touch electrode line distributed in each of the pixels 40. In the arrangement, in each row of four successively adjacent pixels 40, the arrangement positions of the touch electrode lines in the four pixels 40 may be respectively in the first sub-pixel 401 of the first pixel 40, the second sub-pixel 402 of the second pixel 40, the third sub-pixel 403 of the third pixel 40, and the fourth sub-pixel 404 of the fourth pixel 40. It should be noted that the arrangement positions of the touch electrode lines Tx in the three pixels 40 may be adjusted as long as they are not repeatedly disposed in the same sub-pixels.

In this way, in the four successively adjacent pixels 40 of the same row, the touch electrode lines Tx may be evenly and non-repeatedly distributed in the first sub-pixel 401, the second sub-pixel 402, the third sub-pixel 403, and the fourth sub-pixel 404, whereby the display abnormality caused by the wiring positions of the touch electrode lines Tx can be effectively prevented.

In a yet another specific arrangement of the present example, the pixels 40 each include four sub-pixels, and there are two touch electrode lines Tx distributed in each of the pixels 40. In the arrangement, in each row of six successively adjacent pixels, the arrangement positions of the touch electrode lines Tx in the six pixels may be respectively in the first and second sub-pixels 401 and 402 of the first pixel 40, in the first and third sub-pixels 401 and 403 of the second pixel 40, in the first and fourth sub-pixels 401 and 404 of the third pixel 40, in the second and third sub-pixels 402 and 403 of the fourth pixel 40, in the second and fourth sub-pixels 402 and 404 of the fifth pixel, and in the third and fourth sub-pixels 403 and 404 of the sixth pixel 40. It should be noted that the arrangement positions of the touch electrode lines Tx in the six pixels 40 may be adjusted as long as they are not repeatedly disposed in the same sub-pixels.

In this way, in the six successively adjacent pixels 40 of the same row, the touch electrode lines Tx may be evenly and non-repeatedly distributed in the first sub-pixel 401, the second sub-pixel 402, the third sub-pixel 403, the fourth sub-pixel 404, the fifth sub-pixel 405 and the sixth sub-pixel 406, whereby the display abnormality caused by the wiring positions of the touch electrode lines Tx can be effectively prevented.

It may be known from the above specific arrangements that, according to the number of sub-pixels in the pixel 40 and the number of the touch electrode lines Tx in each pixel 40, with the design scheme provided in this exemplary arrangement that in CZ successively adjacent pixels 40 in each row, the touch electrode lines Tx do not have repeated arrangement positions, the uniform distribution of the touch electrode lines Tx may be controlled so as to prevent the effect of isolation and shielding of the touch electrode lines Tx from being focused on a specific sub-pixel to make the sub-pixel have relatively large different capacitance distribution than other sub-pixels, thus alleviating the color display abnormality caused by the touch electrode lines Tx and improving the display quality and yield of the display product.

Figure 7:
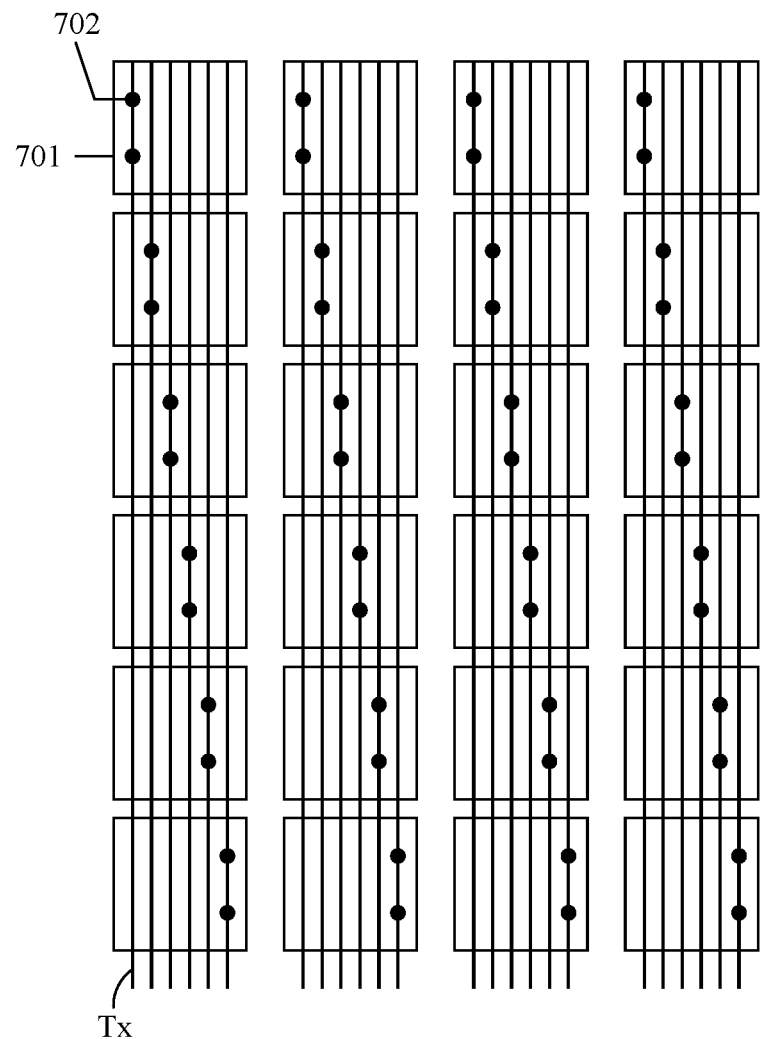
FIG. 7 schematically shows a schematic structural view of a self-capacitance in-cell array substrate in an exemplary arrangement of the present disclosure.

In this exemplary arrangement, as shown in FIG. 7, the array substrate may further include a plurality of common electrodes 701 arranged in an array. The common electrodes 701 may be multiplexed as touch electrodes, and each touch electrode may pass through a via 702 and correspondingly connected to a touch electrode line Tx. In the display stage, the common electrode 701 can be used to provide a common voltage; in the touch stage, the common electrode 701 can be used to provide a touch signal. Of course, the array substrate may also include separately disposed touch electrodes, which is not limited in this arrangement.

On this basis, each touch electrode line Tx may also be connected to a touch circuit such as a touch chip through a corresponding touch switch such as a thin film transistor, so that exchange of information may be achieved between the touch electrodes and the touch circuits through the touch switches, and touch functionality is achieved.

This exemplary arrangement also provides a touch display device including the above array substrate.

The touch display device may be a liquid crystal display device. In this case, the touch display device may include the above-mentioned array substrate, a color film substrate provided with cells being aligned, and a liquid crystal layer disposed therebetween.

The touch display device can also be provided with an organic light emitting diode display device. In this case, the touch display device may include the above-mentioned array substrate, a package substrate or a package film disposed with cells being aligned, and an organic light emitting element disposed on the array substrate.

In the exemplary arrangements, the touch display device may include, for example, any product or component having a display function such as a mobile phone, a tablet computer, a television, a notebook computer, a digital photo frame and a navigator.

Those skilled in the art will readily recognize other arrangements of the present disclosure upon consideration of the specification and practice of the arrangements disclosed herein. This application is intended to cover any variations, uses, or adaptations of the present disclosure which follow the general principles of the present disclosure and include common knowledge or conventional techniques in this technical field not disclosed by the present disclosure. The description and examples are to be considered exemplary only, and the true scope and spirit of the disclosure are defined by the appended claims.

It should be understood that the present disclosure is not limited to the precise structure that has been described above and shown in the drawings, and various modifications and changes may be made without departing from the scope thereof. The scope of the present disclosure is limited only by the appended claims.

What is claimed is:

1. An array substrate comprising
a plurality of pixels arranged in an array; and
a plurality of touch electrode lines arranged along a direction of data lines, wherein at least one of the touch electrode lines is distributed in each of the pixels,
wherein in the pixels of the same row, the touch electrode lines have different arrangement positions relative to corresponding pixels,
wherein the pixels each comprises three sub-pixels, and one touch electrode line is distributed in each of the pixels,
wherein in each row of three successively adjacent pixels, the arrangement positions of the touch electrode lines in the three successively adjacent pixels are respectively in a first sub-pixel, a second sub-pixel, and a third sub-pixel.

2. The array substrate according to claim 1, wherein each touch electrode line is disposed adjacent to a data line of each of the pixels in which each touch electrode line is disposed.

3. The array substrate according to claim 2, wherein two touch electrode lines are distributed in each of the pixels; wherein in each row of three successively adjacent pixels, the arrangement positions of the touch electrode lines in the three successively adjacent pixels are respectively in a first sub-pixel and a second sub-pixel, in the second sub-pixel and a third sub-pixels, and in the first sub-pixel and the third sub-pixels.

4. The array substrate according to claim 2, wherein the pixels each comprises four sub-pixels, and one touch electrode line is distributed in each of the pixels; wherein in each row of four successively adjacent pixels, the arrangement positions of the touch electrode lines in the four successively adjacent pixels are respectively in a first sub-pixel, a second sub-pixel, a third sub-pixel, and a fourth sub-pixel.

5. The array substrate according to claim 2, wherein the pixels each comprises four sub-pixels, and two touch electrode lines are distributed in each of the pixels; wherein in each row of six successively adjacent pixels, the arrangement positions of the touch electrode lines in the six pixels are respectively in a first sub-pixel and a second sub-pixel, in the first sub-pixel and a third sub-pixel, in the first sub-pixel and a fourth sub-pixel, in the second sub-pixel and the third sub-pixel, in the second sub-pixel and the fourth sub-pixel, and in the third sub-pixel and the fourth sub-pixel.

6. The array substrate according to claim 1, wherein the array substrate further comprises a plurality of common electrodes arranged in an array which are multiplexed as touch electrodes;
wherein the touch electrodes are connected with corresponding touch electrode lines through vias.

7. The array substrate according to claim 6, wherein the array substrate further comprises a plurality of touch switches and a touch circuit connected to the touch switches;
wherein the touch switches are connected with the touch electrode lines in one-to-one correspondence.

8. A touch display panel comprising an array substrate, wherein the array substrate comprises:
a plurality of pixels arranged in an array; and
a plurality of touch electrode lines arranged along a direction of data lines, wherein at least one of the touch electrode lines is distributed in each of the pixels,
wherein in the pixels of the same row, the touch electrode lines have different arrangement positions relative to corresponding pixels, wherein the pixels each comprises three sub-pixels, and one touch electrode line is distributed in each of the pixels, wherein in each row of three successively adjacent pixels, the arrangement positions of the touch electrode lines in the three successively adjacent pixels are respectively in a first sub-pixel, a second sub-pixel, and a third sub-pixel.

9. The touch display panel according to claim 8, wherein the touch display panel further comprises a color film substrate provided relative to the array substrate with cells being aligned, and a liquid crystal layer disposed between the array substrate and the color film substrate.

10. The touch display panel according to claim 8, wherein the touch display panel further comprises a package substrate provided relative to the array substrate with cells being aligned, and organic light emitting elements disposed on the array substrate.

\* \* \* \* \*